(12) United States Patent
Ishida et al.

(10) Patent No.: US 8,389,411 B2
(45) Date of Patent: Mar. 5, 2013

(54) METHOD OF MANAGING SUBSTRATE

(75) Inventors: Masahiko Ishida, Susono (JP); Naoki Morimoto, Susono (JP); Kouji Sokabe, Susono (JP)

(73) Assignee: Ulvac, Inc., Kanagawa (JP)

( * ) Notice: Subject to any disclaimer, the term of this patent is extended or adjusted under 35 U.S.C. 154(b) by 62 days.

(21) Appl. No.: 13/119,985

(22) PCT Filed: Oct. 5, 2009

(86) PCT No.: PCT/JP2009/005148
§ 371 (c)(1),
(2), (4) Date: Apr. 21, 2011

(87) PCT Pub. No.: WO2010/041409
PCT Pub. Date: Apr. 15, 2010

(65) Prior Publication Data
US 2011/0201139 A1    Aug. 18, 2011

(30) Foreign Application Priority Data
Oct. 7, 2008   (JP) .................... 2008-260562

(51) Int. Cl.
*H01L 21/311* (2006.01)
(52) U.S. Cl. ........................ 438/694
(58) Field of Classification Search ........... 438/694
See application file for complete search history.

(56) References Cited

U.S. PATENT DOCUMENTS
5,761,023 A * 6/1998 Lue et al. ............... 361/234
(Continued)

FOREIGN PATENT DOCUMENTS
JP      01-321136 A    12/1989
JP      07-130827 A    5/1995
(Continued)

OTHER PUBLICATIONS
International Search Report for PCT Patent App. No. PCT/JP2009/005148 (Dec. 22, 2009).

*Primary Examiner* — Charles Garber
*Assistant Examiner* — Andre' C Stevenson
(74) *Attorney, Agent, or Firm* — Cermak Nakajima LLP; Tomoko Nakajima

(57) ABSTRACT

The electrostatic chuck is made up of: a chuck main body having electrodes; a chuck plate of a dielectric material and having a rib portion with which a peripheral edge portion of the substrate is capable of coming into surface contact, and a plurality of supporting portions which are vertically disposed at a predetermined distance from one another in an inner space enclosed by the rib portion; and a gas introduction means for introducing a predetermined gas into the inner space. When the substrate is held by the electrostatic chuck which is arranged to attract the substrate by the chuck plate and to form a gas atmosphere by supplying a predetermined gas into the inner space, a current value is monitored by causing an AC current to flow in a capacitance of the chuck plate through an AC power supply, a gas flow amount is monitored by causing the gas to flow through the gas introduction means, and a substrate state is managed based on a variation in at least one of the current value and the gas flow amount to prevent damages to the substrate.

7 Claims, 2 Drawing Sheets

U.S. PATENT DOCUMENTS

| | | |
|---|---|---|
| 7,558,045 B1 * | 7/2009 | Onate et al. .................... 361/234 |
| 2004/0218339 A1 * | 11/2004 | Nakamura .................... 361/234 |
| 2005/0045821 A1 * | 3/2005 | Noji et al. ..................... 250/311 |
| 2008/0102209 A1 | 5/2008 | Sasaki et al. |
| 2008/0145797 A1 * | 6/2008 | Verbeke et al. ............... 430/322 |

FOREIGN PATENT DOCUMENTS

| | | |
|---|---|---|
| JP | 09-283608 A | 10/1997 |
| JP | 2008-112751 A | 5/2008 |
| JP | 2008-159875 A | 7/2008 |

* cited by examiner

METHOD OF MANAGING SUBSTRATE

This application is a national phase entry under 35 U.S.C. §371 of PCT Patent Application No. PCT/JP2009/005148, filed on Oct. 5, 2009, which claims priority under 35 U.S.C. §119 to Japanese Patent Application No. 2008-260562, filed Oct. 7, 2008, both of which are incorporated by reference.

TECHNICAL FIELD

The present invention relates to a method of managing a substrate and, in particular, to a method of managing a substrate state when mainly a silicon wafer as a substrate to be processed (hereinafter also referred to as a "to-be-processed substrate") is managed, the managing being performed, when a predetermined processing treatment is performed on the substrate while the substrate is kept attracted to a so-called bipolar electrostatic chuck, not to damage the substrate during, and before and after, the attraction of the silicon wafer.

BACKGROUND ART

In the semiconductor manufacturing steps, various processing treatments are performed to obtain desired device structures such as film-forming processing by PVD method, CVD method, or the like, as well as ion implantation processing, heating processing, etching processing, or the like. In a vacuum processing apparatus to perform these processing treatments, there is disposed a so-called electrostatic chuck in order to hold in position a silicon wafer (hereinafter, simply referred to as "wafer") as a substrate to be processed in the processing chamber. As the electrostatic chuck, there is conventionally known in Patent Document 1 a so-called bipolar electrostatic chuck which has mounted a chuck plate of a dielectric material on an upper surface of the chuck main body into which positive and negative electrodes are buried.

Depending on the processing to be performed in the vacuum processing apparatus, there are cases where the wafer is heated to a predetermined temperature. In such a case, it is known that the chuck main body has assembled therein, e.g., a resistance heating type of heating means, and that there is formed a rib portion which comes into surface contact with a peripheral edge portion on a rear surface of the wafer (i.e., the side opposite to the surface on which the predetermined processing is performed). In an inner space enclosed by this rib portion, a plurality of supporting portions are vertically disposed, e.g., in a coaxial manner to thereby constitute a chuck plate. At the time of heating and cooling of the wafer, inert gas such as Ar gas or the like is supplied to the inner space through a gas passage which is formed in the chuck main body. By thus forming an inert gas atmosphere in the inner space to be defined by the rib portion and the rear surface of the wafer, the heat transmission to the wafer is assisted to efficiently heat or cool the wafer.

By the way, in the electrostatic chuck having the above-mentioned constitution, at the time of heating and cooling the wafer, the rib portion and the supporting portion of the chuck plate will get rubbed by the wafer and gradually wear out due to the difference in thermal expansion between the wafer and the electrostatic chuck. As a solution, like in the above-mentioned Patent Document 1, it has so far been practiced to: cause to flow AC current through the capacitance of the chuck plate from an AC power supply to thereby monitor the current value. By thereby judging the limit of use as quickly as possible, the damage to the wafer in the processing chamber due to poor attraction of the wafer or the like can thus be prevented, thereby improving the productivity.

On the other hand, in order to further improve the productivity, there is recently a tendency to use wafers of larger diameter and thinner plate thickness (thickness below 700 µm). This kind of wafers gives rise to warping in various directions due to predetermined processing treatments. In addition, during any of the processing treatments, the state of warping of the wafer will vary due to heating and cooling of the wafer. Therefore, there are cases where wafers get damaged, not only during processing treatment, but also during the time when the warped wafer is held by the electrostatic chuck or when the wafer is transported by releasing the attraction of the wafer. As a result, there is a disadvantage in that only judging the limit of use of the electrostatic chuck cannot improve the productivity while attaining, at the same time, the improvement in the yield of the product. It therefore becomes important how best the wafer state is to be managed.

Prior Art Document

[Patent Document]
Patent Document 1: JP-A-1989-321136

SUMMARY OF THE INVENTION

Problems to be Solved by the Invention

In view of the above points, this invention has a problem of providing a method of managing a substrate state leading to damages to the to-be-processed substrate in which the substrate state leading to a damage to the substrate to be processed (handled) by the electrostatic chuck can be grasped accurately.

Means for Solving the Problems

In order to solve the above-mentioned problems, this invention is a method of managing a substrate when a to-be-processed substrate is held by an electrostatic chuck. The electrostatic chuck comprises: a chuck main body having a plurality of electrodes; a chuck plate of a dielectric material, the chuck plate having a rib portion with which a peripheral edge portion of the to-be-processed substrate is capable of coming into surface contact, and a plurality of supporting portions which are vertically disposed at a predetermined distance from one another in an inner space enclosed by the rib portion; and a gas introduction means for introducing a predetermined gas into the inner space. When the substrate is held by the electrostatic chuck which is arranged to attract the substrate by applying a predetermined voltage between the electrodes and to form a gas atmosphere by supplying a predetermined gas into the inner space, a substrate state is managed to be free from incurring damages to the substrate. The method comprises: monitoring a current value by causing an AC current to flow through a capacitance of the chuck plate by means of an AC power supply; monitoring a gas flow amount by causing the gas to flow from the gas introduction means; and managing the substrate state based on a variation in at least one of the current value and the gas flow amount.

According to this invention, predetermined processing treatments such as heating processing, film-forming processing, or the like are performed in a state in which the substrate remains attracted by the electrostatic chuck having the above-mentioned arrangement. As a result, if the warping of the substrate in the direction in which the clearance becomes larger between the rib portion and the peripheral surface of the substrate (tension direction), the change in the gas leak amount from the inner space through the clearance will cause the amount of gas supply from the gas introduction means to change. On the other hand, if the warping of the substrate becomes larger in the direction in which the central portion of the substrate moves away from the inner space (compression direction), the impedance will increase due to the change in capacitance and, as a result, the current value will change.

In this manner, according to this invention, while the substrate is attracted by the electrostatic chuck, if the substrate warps in any of the directions or if the warping becomes larger, the change will accordingly become larger in the gas flow amount, or in the impedance and, in turn, in the AC current value. As a result, the substrate state leading to the damage to the substrate can be accurately grasped. Consequently, the substrate inside the processing chamber can surely be prevented from being damaged, thereby improving the productivity while improving the yield (available percentage) of the product.

Preferably, the method of managing the substrate state further comprises, when the variation in at least one of the current value and the gas flow amount has exceeded a predetermined threshold value: judging the substrate state to be leading to the damage to the substrate; and controlling at least one of a DC voltage to be applied to both the electrodes and the gas flow amount from the gas introduction means, thereby eliminating said substrate state. Then, undue stress can be prevented from being applied to the substrate, whereby the damage to the substrate can surely be prevented.

Preferably, the method of managing the substrate state further comprises, after having mounted the substrate on the chuck plate: monitoring the current value by causing an AC current to flow before applying a voltage to the electrodes; and judging the substrate to be unacceptable if the current value exceeds a predetermined threshold value. In this manner, the substrate can be prevented from getting damaged by forcibly attracting an unduly warped substrate by the electrostatic chuck.

Further, preferably, the method of managing the substrate state further comprises, after having stopped the charging of voltage from the state of attracting the substrate: judging, based on the current value, the state in which the substrate is capable of being detached from the chuck plate. In a state in which the substrate still remains attracted under the influence of the residual charges right after releasing of attraction, the substrate can surely and advantageously be prevented from getting damaged inside the processing chamber by, e.g., being lifted up for trying to transfer the substrate or for causing the transfer robot to get access to the substrate.

EMBODIMENTS FOR CARRYING OUT THE INVENTION

With reference to the figures, a description will now be made of a method of managing a substrate according to one embodiment of this invention in which, by defining a substrate to be processed as a wafer W, the wafer W is not damaged by an electrostatic chuck C which is disposed inside a vacuum processing apparatus in which processing treatments are performed such as a film-forming processing in PVD method, CVD method or the like, ion implantation processing, heating processing, etching processing, or the like.

Figure 1:
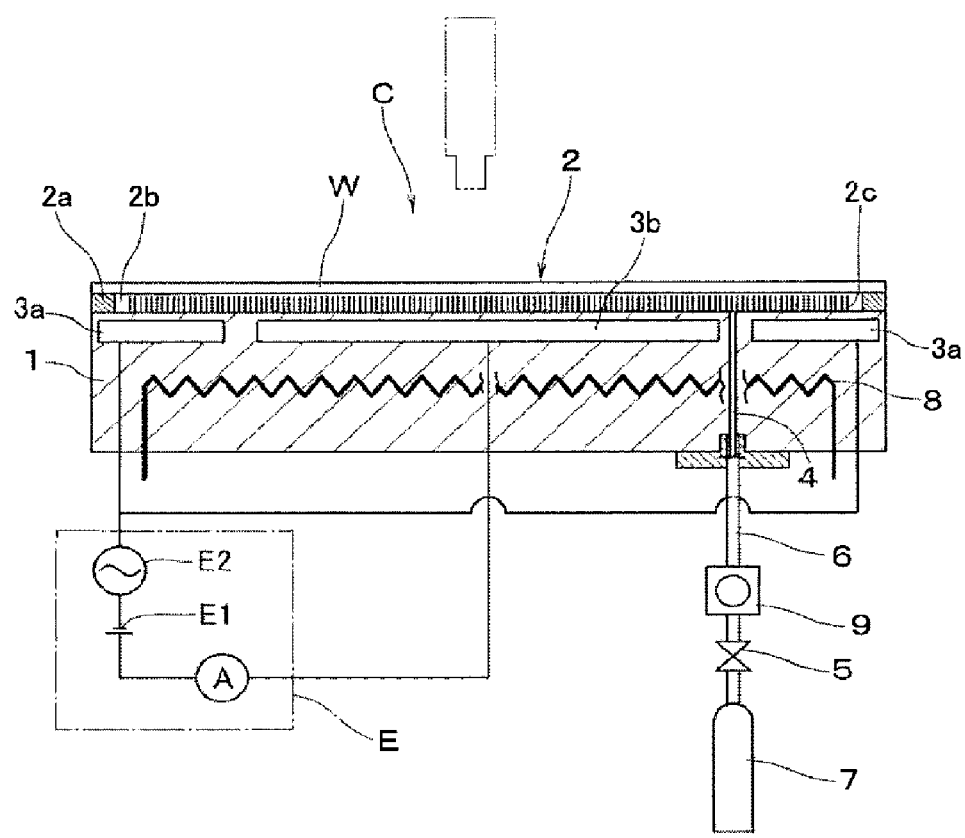
FIG. 1 schematically illustrates the constitution of an electrostatic chuck.

As shown in FIG. 1, the electrostatic chuck C is made up of; a chuck main body 1 which is disposed at a bottom portion of the processing chamber (not illustrated); and a chuck plate 2 which is made of dielectric material which is disposed on an upper surface of the chuck main body 1. For example, the chuck main body 1 made of aluminum nitride has built therein positive and negative electrodes 3a, 3b through insulating layer (not illustrated) so that DC voltage can be applied from a DC power supply El of a known chuck power supply E.

Further, the chuck main body 1 has formed therein a gas passage 4 which is penetrated in a vertical direction. The lower end of this gas passage 4 is in communication with a gas supply 7 which contain therein an inert gas such as Ar gas or the like, through a gas pipe 6 having interposed therein a mass flow controller 5. These parts constitute gas introduction means according to this embodiment. Further, the chuck main body 1 has built therein a heater 8 of resistance heating type having a known construction so that the wafer W can be heated to, and maintained at, a predetermined temperature. In this embodiment, a description has been made of an example in which only the heater 8 is disposed. Without being limited thereto, it may also be constructed by assembling a known cooling means.

The chuck plate 2 is made, e.g., of aluminum nitride and has: a rib portion 2a of annular shape with which an outer peripheral edge portion on the rear surface of the wafer W can be brought into surface contact; and a plurality of bar-shaped supporting portions 2c which are coaxially and vertically disposed in the inner space 2b enclosed by the rib portion 2a. In this case, the height of the supporting portions 2c is set so as to be slightly smaller than the height of the rib portion 2a. In this manner, when the wafer W is attracted to the surface of the chuck plate 2, wafer W can be supported by each of the supporting portions 2c.

Then, by means of electrostatic force that is generated by applying DC voltage to both the electrodes 3a, 3b after having mounted the wafer W on the chuck plate 2, the wafer W will be attracted to the surface of the chuck plate 2. At this time, the outer peripheral edge portion on the rear surface of the wafer W comes into surface contact over the entire circumference thereof with the rib portion 2a, thereby substantially hermetically closing the inner space 2b. In this state, by introducing Ar gas through the gas introduction means, the above-mentioned inner space 2b can form an Ar gas atmosphere. According to this arrangement, when the heater 8 is operated to heat the wafer W, an Ar gas atmosphere is formed in the inner space 2b that is defined by the rib portion 2a and the rear surface of the wafer W, whereby the heat transmission to the wafer W can be assisted to efficiently heat the wafer W.

By the way, since there is provided no sealing member between the peripheral edge portion on the rear surface of the wafer W and the rib portion 2a, there will be a trace amount (e.g., 0.01 to 0.03 sccm) of leak of inert gas even in case the outer peripheral edge portion 2a on the rear surface of the wafer W and the rib portion 2a are in surface contact with each other over the entire circumference.

Figure 2:
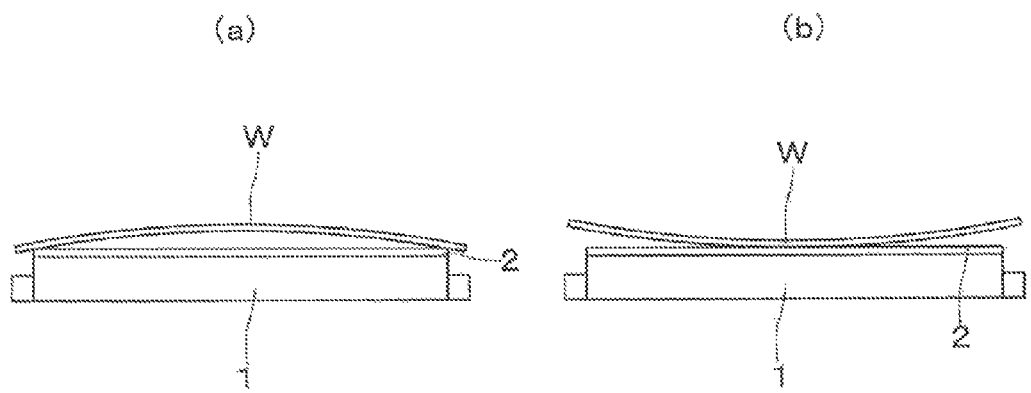
FIGS. 2(a) and 2(b) schematically illustrate the warping of a wafer as a substrate.

Here, as shown in FIGS. 2(a) and 2(b), the wafer W has generated therein warping in the direction of compression or in the direction of tension due, e.g., to the stresses of the wafer's own or due to stresses of the thin film formed on the surface of the wafer W. When this kind of wafer W is attracted to the electrostatic chuck C, it is necessary to manage so that the substrate is not damaged (meaning cracks, breaking or the like) while the heating processing or film-forming processing is performed in a state of keeping the wafer W attracted to the electrostatic chuck C, or while the substrate is transported after having released the attraction by the electrostatic chuck C when the processing treatments have been finished.

In this embodiment, in order to grasp the state of the wafer, an AC power supply E2 is connected in series with the DC power supply E1 inside the chuck power supply E (not illustrated). AC current is caused to flow from the AC power supply E2 through the capacitance of the electrostatic chuck 1. Impedance is monitored from the current value as measured by a known ammeter A, and a gas flow amount of Ar gas is monitored by interposing a known mass flow meter 9 in a gas pipe 6 on the downstream side of the mass flow controller 5.

Figure 3:
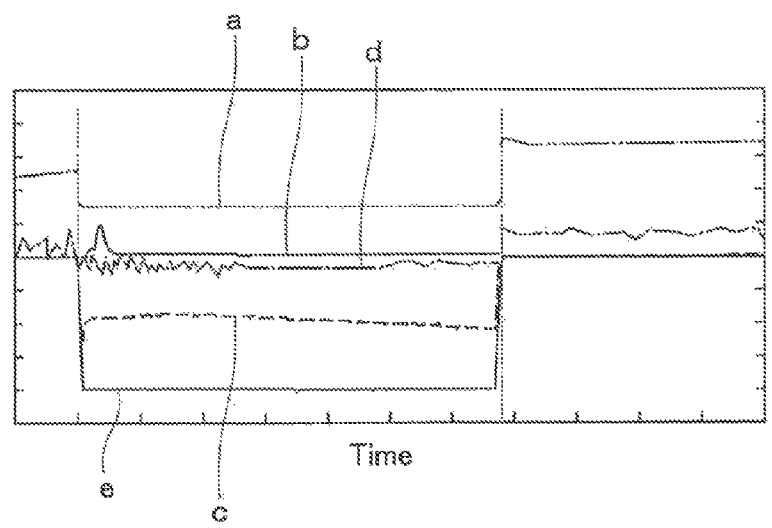
FIG. 3 is a graph explaining the change in impedance and gas flow amount depending on the warping of wafer.

With reference to FIG. 3, a description will be made to the effect that the wafer states can be managed, with reference to a case in which the wafer W having caused warping by the electrostatic chuck C is attracted, particularly in an example in which a warping in the direction of compression has taken place in the wafer W. In this embodiment, as shown in an imaginary line in FIG. 1, a known laser displacement meter is disposed above the central position of the wafer W so that the amount of displacement at the central position can be measured. Here, in FIG. 3, what is shown by chain double-dashed line "a" is the change in impedance. Solid line b shows the change in gas flow amount, the dotted line c shows a variation, the chain line d shows a current value, and the solid line e shows the change in DC voltage to the electrodes.

First, after having mounted the wafer W on the surface of the chuck plate 2, AC current is caused to flow through the AC power supply E2. Based on the current value in the ammeter A at that time, an impedance of the capacitance is measured and, also, a displacement at the central position of the wafer W is measured by the laser displacement meter.

Then, a predetermined DC voltage (e.g., 400 V) is applied between both the electrodes 3a, 3b through the DC power supply E1 of the chuck power supply E to thereby attract the wafer W to the surface of the chuck plate 2. At this time, the outer peripheral edge portion of the rear surface of the wafer W comes into surface contact with the rib portion 2a over the entire circumference thereof and, as a result, the wafer W will attain a substantially horizontal state (see FIG. 1). The impedance and the central position measured at this time showed that the impedance was found to have lowered (lowered by about 10 kΩ), and the central position of the wafer W was found to have been displaced toward the chuck plate 2. When Ar gas was introduced into the inner space 2b at a constant flow amount through the gas introduction means and the gas flow amount was measured by a mass flow meter 9, the flow amount at the beginning became larger and came to indicate a constant value with the lapse of time. Then, simultaneously with the introduction of the Ar gas, the heater 8 was operated to heat the wafer W to a predetermined temperature (e.g., 400° C.) and maintained it for a predetermined period of time.

During the heating of the wafer W, the current value as measured by the ammeter was substantially constant and, as a result, the impedance also became substantially constant. In addition, the gas flow amount and the displacement showed little or no change. Then, when the operation of the heater 8 and the introduction of Ar gas were stopped, and the application of voltage between both the electrodes 3a, 3b was stopped after the lapse of a predetermined period of time, the current value and, in turn, the impedance measured at this time showed an increase of about 20% as compared with the values before attraction. When measurement was made with the laser displacement meter, the displacement became larger than the one before attraction and the warping of the wafer W in the direction of compression became larger.

According to the above, it is found that the state of warping of the wafer W can be accurately managed based on the impedance. In addition, in case the measurement with the laser displacement meter showed that the wafer W gave rise to warping in the direction of compression, it can be seen that there is a correlation between the impedance and the displacement of the wafer W, and that the correlation is substantially in proportional relationship with each other. It can thus be seen from the above that, by measuring the impedance and, in turn, the current value, the amount of warping of the wafer W can be judged. And by managing the above, the state leading to the damage to the wafer W can adequately be managed. As described above, according to the embodiment of this invention, the state leading to the damage to the wafer W can adequately be grasped by the change in the impedance and, in turn, by the change in the current value. Therefore, the productivity can be improved while improving the yield of the products by surely preventing the damages to the wafer W particularly in the processing chamber.

By the way, in case the impedance and, in turn, the current value changed beyond the predetermined threshold values during the processing, a judgment can be made that the state may lead to the damage to the wafer. In such a case, by adequately suspending the predetermined processing, at least one of the DC voltage to be applied between both the electrodes 3a, 3b and the amount of gas flow from the gas introduction means is controlled so as to eliminate the state in which undue stresses are applied to the wafer W. According to this arrangement, the wafer W in the processing chamber can be prevented from being damaged. As to the threshold values, they may be adequately set taking into consideration the size and thickness of the wafer W.

In view of the point that the impedance and the displacement of the wafer W have a correlation with each other, monitoring is made, after having mounted the wafer W on the chuck plate 2, of the current value and, in turn, of the impedance by causing the AC current to flow before applying the DC voltage between the electrodes 3a, 3b. If they are found to have exceeded the predetermined threshold values, a judgment can be made that an undue warping must have taken place with the wafer W and therefore that damages may occur if the wafer W is forcibly attracted by the electrostatic chuck C. Damages to the wafer W in the processing chamber can thus be prevented.

On the other hand, an arrangement may be made that, after having stopped the application of DC voltage from the attracted state of the wafer W, a judgment is made, based on the impedance, of the state in which the wafer W can be detached from the chuck plate 2. Then, in a state in which the wafer W still remains attracted under the influence of the residual charge right after releasing of attraction, the wafer W can surely be prevented from getting damaged inside the processing chamber by, e.g., being lifted up for trying to transfer the substrate or for causing the transfer robot to get access to the substrate.

Further, in this embodiment, a description has mainly been made of an example in which a warping has occurred to the wafer W in the direction of compression. In case warping has occurred during processing or before or after the processing, in the direction of tension as shown in FIG. 2(b), the rib portion 2a and the peripheral edge portion of the wafer W will not come into surface contact with each other even if the wafer W is attracted to the chuck plate 2. As a result, the clearance between the two becomes large and the amount of gas to leak therethrough will increase. As a result, the gas flow amount that is being measured by the mass flow meter 9 will also change. In this manner, since there is a correlation between the gas flow amount and the warping amount of the wafer W in the direction of tension, by managing the gas flow amount, the warping amount of the wafer W can be judged and, by making the management thereof, the state leading to the damage to the wafer W can adequately be managed. In a manner similar to the above, the wafer W can be prevented from being damaged in the processing chamber.

DESCRIPTION OF REFERENCE NUMERALS AND CHARACTERS

C electrostatic chuck
1 chuck main body
2 chuck plate
2a rib portion
2b inner space
2c supporting portion
3a, 3b electrode
5 mass flow controller (gas introduction means)
7 gas source (gas introduction means)
9 mass flow meter
A ammeter
E chuck power supply
W wafer

What is claimed is:

1. A method of managing a substrate when a to-be-processed substrate is held by an electrostatic chuck, the electrostatic chuck comprising: a chuck main body having a plurality of electrodes; a chuck plate of a dielectric material, the chuck plate having a rib portion with which a peripheral edge portion of the to-be-processed substrate is capable of coming into surface contact, and a plurality of supporting portions which are vertically disposed at a predetermined distance from one another in an inner space enclosed by the rib portion; and a gas introduction means for introducing a predetermined gas into the inner space; wherein, when the substrate is held by the electrostatic chuck which is arranged to attract the substrate by applying a predetermined voltage between the electrodes and to form a gas atmosphere by supplying a predetermined gas into the inner space, a substrate state is managed to be free from incurring damages to the substrate, the method comprising: monitoring a current value by causing an AC current to flow through a capacitance of the chuck plate by means of an AC power supply; monitoring a gas flow amount by causing the gas to flow from the gas introduction means; and managing the substrate state based on a variation in at least one of the current value and the gas flow amount by contacting the surface with the rib portion over the circumference of the substrate.

2. The method of managing the substrate according to claim 1, further comprising, when the variation in at least one of the current value and the gas flow amount has exceeded a predetermined threshold value:
    judging the substrate state to be leading to the damage to the substrate; and
    controlling at least one of a DC voltage to be applied to both the electrodes and the gas flow amount from the gas introduction means, thereby eliminating said substrate state.

3. The method of managing the substrate according to claim 1, further comprising, after having mounted the substrate on the chuck plate:
    monitoring the current value by causing an AC current to flow before applying a voltage to the electrodes; and
    judging the substrate to be unacceptable if the current value exceeds a predetermined threshold value.

4. The method of managing the substrate according to claim 1, further comprising, after having stopped the charging of voltage from the state of attracting the substrate:
    judging, based on the current value, the state in which the substrate is capable of being detached from the chuck plate.

5. The method of managing the substrate according to claim 2, further comprising, after having mounted the substrate on the chuck plate:
    monitoring the current value by causing an AC current to flow before applying a voltage to the electrodes; and
    judging the substrate to be unacceptable if the current value exceeds a predetermined threshold value.

6. The method of managing the substrate according to claim 2, further comprising, after having stopped the charging of voltage from the state of attracting the substrate:
    judging, based on the current value, the state in which the substrate is capable of being detached from the chuck plate.

7. The method of managing the substrate according to claim 3, further comprising, after having stopped the charging of voltage from the state of attracting the substrate:
    judging, based on the current value, the state in which the substrate is capable of being detached from the chuck plate.

* * * * *